United States Patent
Yamazaki (10) Patent No.: US 8,088,296 B2
(45) Date of Patent: Jan. 3, 2012

(54) PLASMA PROCESSING DEVICE AND PLASMA PROCESSING METHOD

(75) Inventor: Katsuhiro Yamazaki, Yokohama (JP)

(73) Assignee: Shibaura Mechatronics Corporation, Kanagawa (JP)

( * ) Notice: Subject to any disclaimer, the term of this patent is extended or adjusted under 35 U.S.C. 154(b) by 1105 days.

(21) Appl. No.: 11/574,570

(22) PCT Filed: May 19, 2005

(86) PCT No.: PCT/JP2005/009172
§ 371 (c)(1),
(2), (4) Date: Oct. 24, 2007

(87) PCT Pub. No.: WO2006/025136
PCT Pub. Date: Mar. 9, 2006

(65) Prior Publication Data
US 2008/0283498 A1 Nov. 20, 2008

(30) Foreign Application Priority Data
Sep. 1, 2004 (JP) .................................. 2004-254241

(51) Int. Cl.
*B44C 1/22* (2006.01)
(52) U.S. Cl. .................. 216/67; 216/76; 216/77; 216/80
(58) Field of Classification Search .................. 216/67, 216/76, 77, 80
See application file for complete search history.

(56) References Cited

U.S. PATENT DOCUMENTS

| 6,365,486 B1 * | 4/2002 | Agarwal et al. ............... 438/393 |
|---|---|---|
| 6,776,851 B1 | 8/2004 | Singh et al. |
| 6,939,795 B2 | 9/2005 | Eissa et al. |
| 2001/0010228 A1 | 8/2001 | Au et al. |
| 2003/0190790 A1 * | 10/2003 | Hwang et al. ............... 438/287 |

FOREIGN PATENT DOCUMENTS

| JP | 05-152333 | 6/1993 |
|---|---|---|
| JP | 06-140368 | 5/1994 |
| JP | 6132259 | 5/1994 |
| JP | 05-330283 | 11/1994 |

(Continued)

OTHER PUBLICATIONS

EP Application No. 05741627.3-1235 Office Action dated Apr. 5, 2011, 5 pages.

*Primary Examiner* — Binh X Tran (57) ABSTRACT

The present invention prevents drop in the function of a plasma processing device caused by reduction of a plasma generating chamber by reductive plasma that is generated from the introduced process gas, and extends the life of members which are in contact with reductive plasma, especially the plasma generating chamber member. The plasma processing device of this embodiment is a device for treating the surface of a processing subject S using radicals generated by exciting a process gas, wherein a plasma generating chamber member 6, having a internal plasma generating chamber 6a, is connected to a gas introduction tube 5 attached to the outside of the process chamber 1, and a gas regulator 7 is provided on the end of the plasma generating chamber member 6. The configuration is such that when the plasma generating chamber member 6 is reduced by the reductive plasma generated from the gas introduced from the gas regulator 7, a reoxidation gas will be introduced into the plasma generating chamber 6a in place of the reductive gas from the gas regulator 7.

9 Claims, 6 Drawing Sheets

FOREIGN PATENT DOCUMENTS

| | | |
|---|---|---|
| JP | 09-106977 | 4/1997 |
| JP | 10-098026 | 4/1998 |
| JP | 2001-335937 | 12/2001 |
| JP | 2003-124311 | 4/2003 |
| JP | 2004-111731 | 4/2004 |
| JP | 2004-119977 | 4/2004 |
| JP | 2005310960 | 11/2005 |

* cited by examiner

[EFFECT OF REOXIDATION USING $O_2$ PLASMA]

FIG.3

[ASHING RATE AND DISCHARGE CHAMBER MEMBER MATERIAL]
(DEACTIVATION OF HYDROGEN RADICALS)

FIG.4

[DIFFERENCES IN ASHING RATE TRENDS DEPENDING ON DISCHARGE CHAMBER MEMBERS]

PLASMA PROCESSING DEVICE AND PLASMA PROCESSING METHOD

TECHNICAL FIELD

The present invention relates to a plasma processing device used when manufacturing semiconductor devices and liquid crystal display devices and the like, and more particularly to technology for preventing functional degradation of a plasma processing device that uses reductive plasma and for extending the life of a device member.

BACKGROUND TECHNOLOGY

LSI (Large Scale Integration) circuits are semiconductor integrated circuits which have over 1000 elements, and ULSI or the like are those which have over one million elements stored on a single chip, and in recent years, 100 million or more elements have been formed on a single chip.

This type of ULSI cannot be accommodated simply by miniaturizing elements on a plane, so multiple layer wiring construction with a plurality of overlapping layers of wiring has become essential. A multiple layer wiring construction increases the capacitance between layers and causes the elements to have longer signal delay times, so in order to reduce the capacitance between layers, a low dielectric constant inter layer insulating film (herein after referred to as Low-K film) is used as an insulating film between layers.

On the other hand, in the ashing process which removes the resist mask that is no longer required after patterning the Low-K film on a wafer that has exposed Low-K film, a gas that includes hydrogen which is a reductive gas is used as the ashing gas in order to minimize the increase in the dielectric constant of the Low-K film that is caused during ashing.

Furthermore, in addition to the aforementioned case, processing by reductive plasma represented by hydrogen plasma is performed during the manufacturing process for semiconductor manufacturing devices (For instance refer to patent documents 1 and 2), and processing using a hydrogen plasma is performed in the manufacturing process for liquid crystal display devices (for instance refer to patent documents 3 and 4).

Patent Document 1: Japanese Laid-open Patent Application H6-140368
Patent Document 2: and Japanese Laid-open Patent Application 2003-124311
Patent Document 3: Japanese Laid-open Patent Application H5-152333
Patent Document 4: Japanese Laid-open Patent Application H6-330283
Patent Document 5: Japanese Laid-open Patent Application 2004-111731

DISCLOSURE OF THE INVENTION

Problem to be Resolved by the Invention

However, the result of independent tests by the present inventors has made clear that when processing is performed using this type of hydrogen plasma, the plasma generating chamber member will be reduced by the reductive plasma and therefore there will be problems with a drop in the ashing rate. Furthermore, similar problems will occur during the film forming operation using hydrogen gas or when ashing is performed using reductive plasma.

Furthermore, as shown in Patent Document 5 for example, a method where cleaning the inside of a discharge chamber or the like using oxygen plasma was disclosed as a method of removing reaction products from the inside of a reaction chamber after plasma etching is performed. However, this type of cleaning method is technology to remove adhering material using oxidative decomposition, and is not used to restore reduced plasma generating chamber members.

The present invention was proposed based on recognizing these issues, and an object of the present invention is to provide a plasma processing device and plasma processing method that prevents a reduction in the function of the plasma processing device caused by reduction of the plasma generating chamber member by reductive plasma and that can extend the life of members which are in contact with the reductive plasma and especially the plasma generating chamber member.

Means for Resolving Problems

In order to achieve the aforementioned object, the present invention is a plasma processing device comprising: a plasma generating chamber in which plasma is generated by exciting a gas and which is formed at least in part of a dielectric material; and a gas regulator that introduces the gas into the plasma generating chamber, characterized in that the gas regulator comprises means for supplying a reductive gas and means for supplying a reoxidizing gas, and when a member contacting the reductive plasma generated by exciting the reductive gas, the reoxidizing gas is introduced into the plasma generating chamber in place of the reductive gas. Furthermore as another embodiment, the present invention can be taken from the viewpoint of a method.

With the aforementioned embodiment, if the dielectric material which forms the plasma generating chamber is reduced, reoxidation can be performed using a reoxidizing gas plasma on the reduced dielectric material by introducing a reoxidizing gas from the gas regulator, and can prevent a drop in the function of the plasma processing device caused when the member that contacts the reductive plasma is reduced. Furthermore, the frequency of replacing the member which contacts the reductive plasma and particularly the plasma generating chamber member can be reduced, and the life thereof can be extended. Herein, the member which contacts the reductive plasma includes any member which composes the plasma processing device and contacts the reductive plasma that is introduced. Specifically, the plasma generating chamber members which form the plasma generating chamber, as well as the inner walls and diffusion plate of the process chamber where plasma processing is performed on the processing subject, as well as the support stand or the like.

In a preferred embodiment, the present invention is a plasma processing device further comprising a detecting unit for detecting whether the member that contacts the reductive plasma is reduced by the reductive plasma generated by exciting the reductive gas or is reoxidized by introducing a reoxidized and gas into the plasma generating chamber, wherein the gas regulator switches the gas that is introduced into the plasma generating chamber based on a detection result from the detecting unit. Furthermore, this embodiment can also be considered as an invention of a method.

With the aforementioned embodiment, whether the plasma generating chamber member is reduced or reoxidized is detected by the detecting means and can automatically switch the gas, so degradation of the plasma generating chamber can be prevented, and the function of the processing device can be made stable.

Furthermore, in a preferred embodiment, the reoxidizing gas comprises oxygen, and the dielectric member comprises any one of quartz, alumina, sapphire, or aluminum nitride.

The present invention described above can prevent a drop in the function of the plasma processing device caused by reduction of the plasma generating chamber member by reductive plasma and that can extend the life of members which are in contact with reductive plasma and especially the plasma generating chamber member.

BEST MODE FOR CARRYING OUT THE INVENTION

Next, a mode for carrying an invention (herein after referred to as embodiment) will be described specifically using the example of a chemical dry etching device.

Constitution

Figure 1:
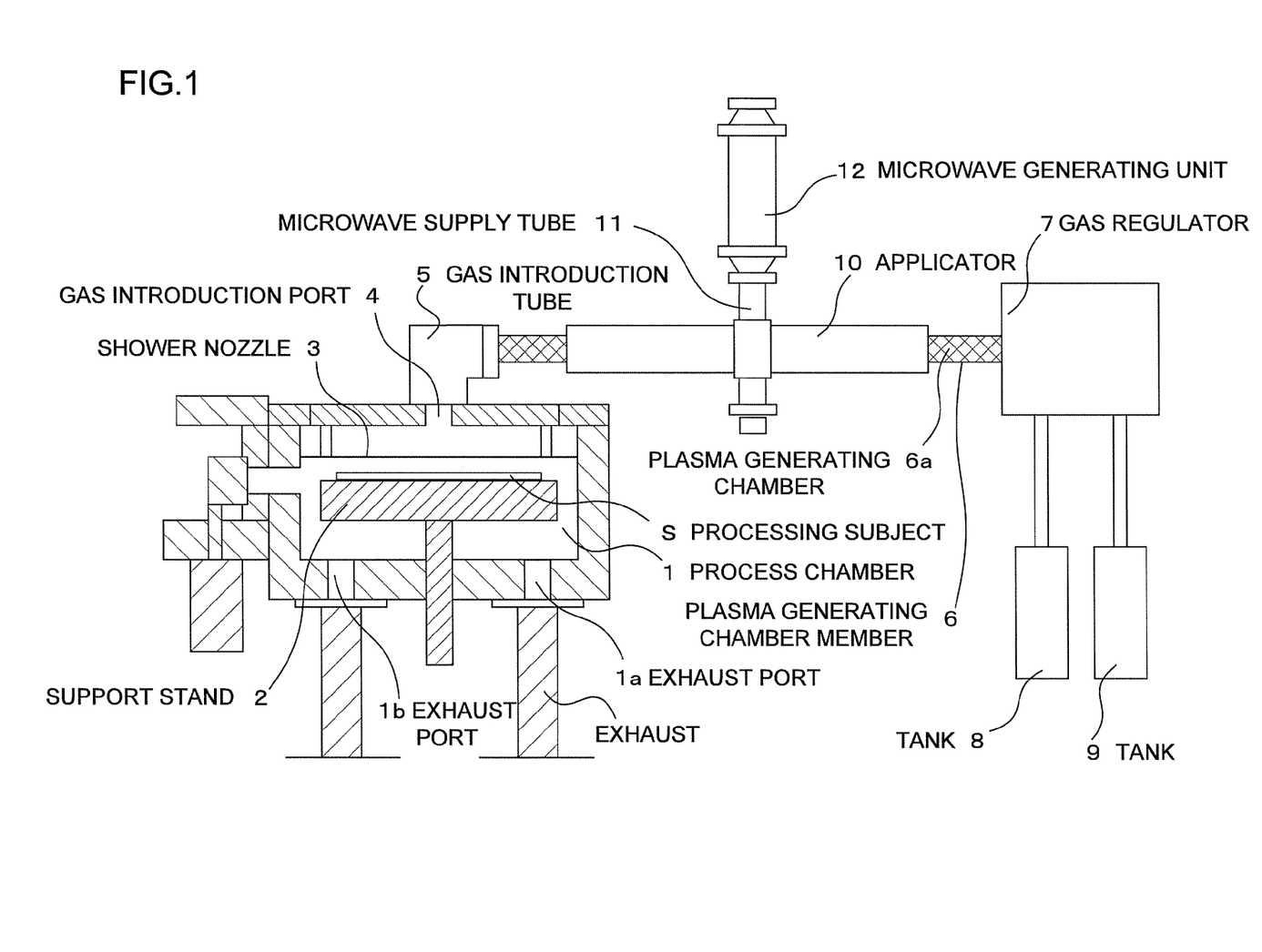
FIG. 1 is a block diagram showing an embodiment of the present invention.

The plasma processing device of the present embodiment is a device for treating the surface of a processing subject S using radicals which are generated by exciting a process gas, and as shown in FIG. 1, the device is comprising a process chamber 1 which can be evacuated inside through exhaust ports 1a, 1b, and a support stand 2 onto which the processing subject S is placed in the process chamber 1.

A shower nozzle 3 is provided across from the support stand 2 in order to uniformly supply the radical to the entire surface of the processing work S. Furthermore, a gas introduction port 4 is provided in the top of the process chamber 1, and a gas introduction tube 5 is attached to the gas introduction port 4. The processing subject can conceivably be a silicon wafer for manufacturing a semiconductor device or a glass substrate.

A plasma generating chamber member 6 has a internal plasma generating chamber 6a and is connected to a gas introduction tube 5 attached to the outside of the process chamber 1, and a gas regulator 7 is provided on the end of the plasma generating chamber member 6. Furthermore, the gas regulator 7 is connected to a tank 8 which stores a gas comprising hydrogen for example as the reductive gas, and to a tank 9 which stores a gas comprising oxygen as the reoxidizing gas. Furthermore, the gas regulator 7 suitably controls whether the gas comprising hydrogen or the gas comprising oxygen is introduced into the plasma generating chamber 6a.

Furthermore, the construction is such that an applicator 10 is provided in the center of the plasma generating chamber member 6 and microwaves are applied into the plasma generating chamber 6a from a microwave generating unit 12 provided at the top thereof via a microwave supply tube 11. Thereby glow discharge will occur in the plasma generating chamber 6a, plasma will be generated, and radicals will be produced. Furthermore, the construction is such that these radicals are introduced into the process chamber 1 via the gas introduction tube 5 and the gas introduction port 4. Note, quartz ($SiO_2$), alumina ($Al_2O_3$), sapphire, or aluminum nitride or the like can be used as the dielectric material which forms the plasma generating chamber member 6.

Function

With the plasma processing device of the present embodiment having the aforementioned construction, when a plasma generating chamber member 6 formed from a dielectric material as described above is reduced by reductive plasma generated from a gas comprising hydrogen, gas comprising oxygen will be introduced into the plasma generating chamber 6a in place of the gas comprising hydrogen by the gas regulator 7, the gas comprising oxygen will be excited in the plasma generating chamber 6a, and the dielectric material can be restored by reoxidation using this oxygen plasma.

Therefore, determining whether or not the plasma generating chamber member 6 is reduced can be performed by a method using time control as shown below. For example, the timing that gas comprising oxygen is introduced in place of gas comprising hydrogen by the gas regulator 7 can be alternated after each prescribed processing lot, or introduction can be alternated at prescribed time intervals.

Furthermore, obviously an operator can visually check the inner surface of the plasma generating chamber member 6 and the gas comprising oxygen can suitably be introduced into the plasma generating chamber 6a based on the judgment of the operator. Note, in the present embodiment, the method of time control and the method of visual confirmation by an operator is presumed.

Figure 5:
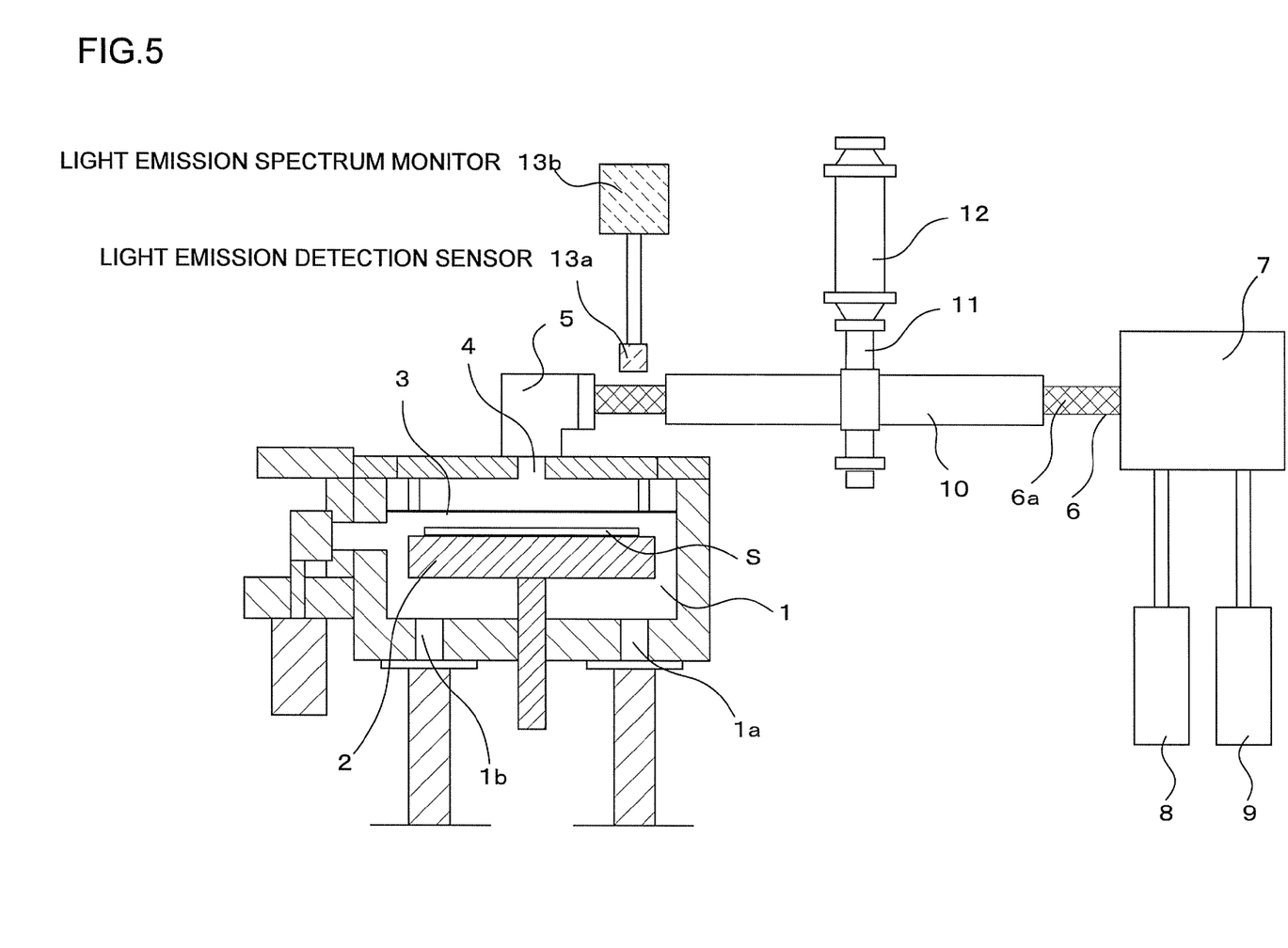
FIG. 5 is a diagram showing an alternate example of an embodiment of the present invention.

Furthermore, as shown for instance in FIG. 5, a light emission detection sensor 13a and an emission light spectrum monitor 13b are provided at the top of the plasma generating chamber member 6, and thereby a determination of whether or not the discharged chamber material 6 has been reduced can be made by detecting the plasma light and the amount of hydrogen radicals produced in the plasma generating chamber 6a.

More specifically, a change (drop) in the total amount of plasma light emission is detected by an emission light detecting sensor 13a, and a drop in the overall intensity of the light emission spectrum across a wavelength range of 300 to 800 nm or the like is detected by the emission light spectrum monitor 13b. Furthermore, the detection results are fed back for controlling the gas regulator 7. Furthermore, it is also possible to detect a drop in the emission light intensity at wavelengths of 434 nm, 486 nm, and 656 nm, which is the emission light spectrum for hydrogen. Note, in this case the timing for completing the reoxidizing process performed by introducing the oxygen plasma can similarly be performed by detecting the change in the amount of light emitted by the oxygen plasma using the light emission spectrum monitor 13b.

Figure 6:
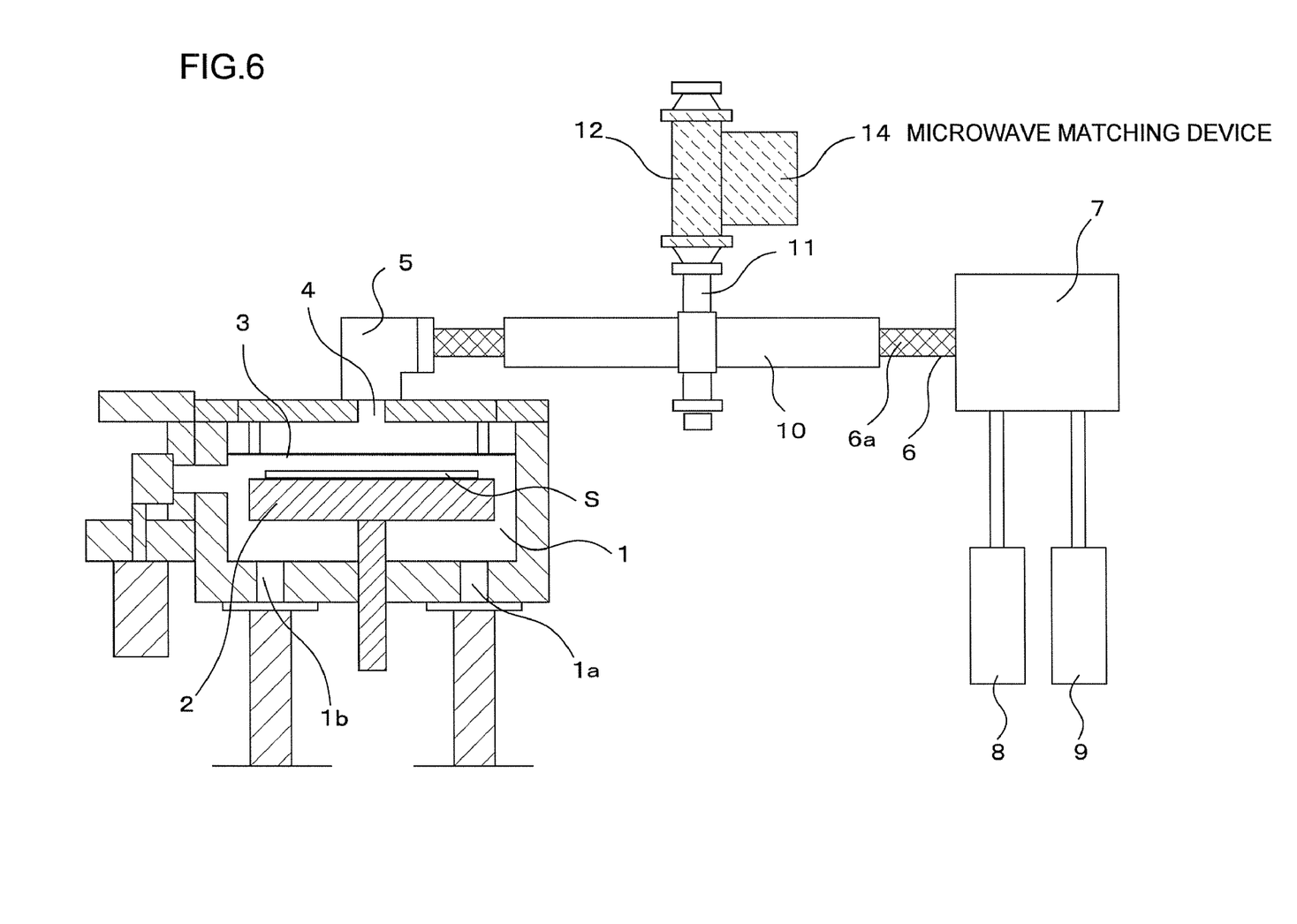
FIG. 6 is a diagram showing an alternate example of an embodiment of the present invention.

Furthermore, as shown in FIG. 6 for instance, changes such as the matching stable position, as well as the incidence or reflectance efficiency or the like can be detected during discharge for the microwave supply tube 11, using a microwave matching device 14 attached to the microwave supply tube 11, and these detection results can be fed back to the gas regulator 7. However, in any of the aforementioned cases, after reduction has been detected, introduction of hydrogen plasma by the gas regulator 7 will not be performed during processing of the processing subject S, and introduction will be performed after processing is complete or processing of the processing subject will be halted at that point in time.

Figure 3:
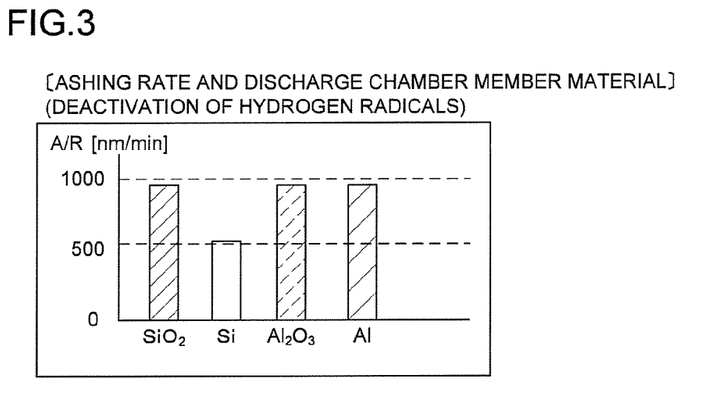
FIG. 3 is a comparison diagram showing the ashing rate for the embodiment of the present invention.
Figure 4:
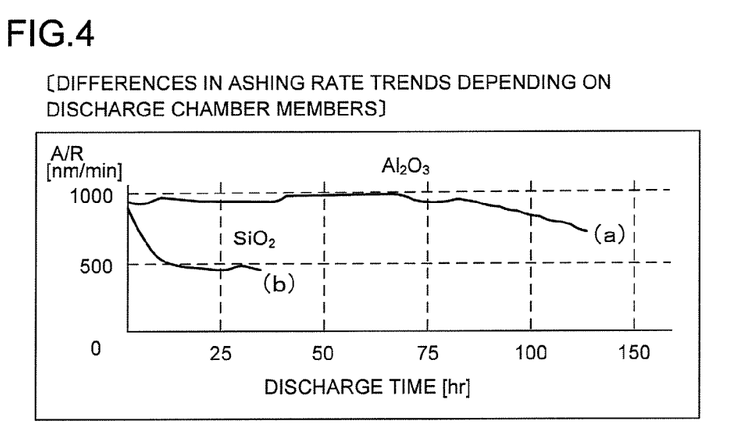
FIG. 4 is a comparison diagram showing an example of an embodiment of the present invention.

Next, the function of the present embodiment for the case where the plasma generating chamber member 6 is $SiO_2$ (quartz) will be described as an example of hydrogen plasma processing in the ashing process for a semiconductor device. If the plasma generating chamber member 6 is made from $SiO_2$, when a gas containing hydrogen is supplied from the gas regulator 7 and the hydrogen plasma is excited in the plasma generating chamber 6a over a discharge time of several tens of hours, the $SiO_2$ that forms the plasma generating chamber member 6 will be reduced to Si. When the $SiO_2$ is converted to Si by reduction from the hydrogen plasma, the hydrogen radicals required for ashing will be dramatically deactivated as shown in FIG. 3. Therefore, as shown in FIG. 4B, the ashing rate normally drops after several tens of hours.

Therefore, when the gas regulator 7 introduces a gas comprising oxygen into the plasma generating chamber 6a, oxygen plasma can be excited in the plasma generating chamber 6a, and the Si will be reoxidized. Therefore the plasma generating chamber member 6 which had been reduced to Si will be reoxidized and restored, so a reduction in the ashing rate can be prevented. Furthermore, by restoring the plasma generating chamber member 6 by reoxidation, the frequency for replacing the member can be reduced, and the life of the member can be extended. Note, the timing for introducing the gas comprising oxygen into the plasma generating chamber 6a by the gas regulator 7 can be performed by any of the aforementioned methods.

Figure 2:
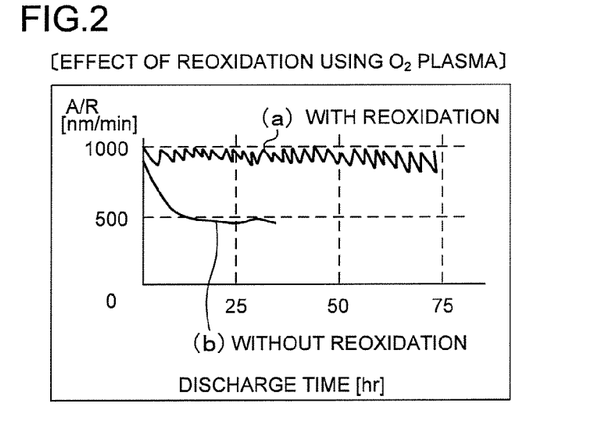
FIG. 2 is a comparison diagram showing an example of an embodiment of the present invention.

An example of the aforementioned function will be described in detail. FIG. 2 is a graph showing the ashing rate (A/R) in a plasma generating chamber member 6 made from $SiO_2$ for the case where Si has been reoxidized by oxygen plasma after each processing lot, and the case where reoxidizing was not performed. Note, the processing conditions were: a process gas comprising 350 sccm (standard cubic centimeters per minute) of $H_2$, 6650 sccm of He, a pressure of 100 Pa (Pascal) a microwave power of 1000 W (Watts), a support stand temperature of 350° C., and a reoxidation gas comprising 7000 sccmm of $O_2$, a pressure of 100 Pa, a microwave power of 1000 W, and a support stand temperature of 350° C.

Furthermore, the reoxidation processing time under these processing conditions is calculated from the equation:

Processing time per processing subject for the process where $H_2$ is added×number of processing sheets× $H_2$ concentration (%)

For instance, if the processing time per sheet of processing subject is 120 seconds for a process where $H_2$ (5%)/He (95%)=350 sccm/6650 sccm, and 25 processing sheets is (1 LOT), the reoxidation time will be "120 seconds×25 sheets (1 lot)×5%=150 sec".

Furthermore, if reoxidation is performed for a short period of time after a certain length of time, the reoxidation time is adjusted by considering the processing time up to that point in time, the number of sheets processed, and the $H_2$ concentration or the like. Note, in the aforementioned case, in order to maintain an equivalent level of contact between the hydrogen plasma and the oxygen plasma on the surface in the plasma generating chamber 6a, the pressure, microwave power, and support stand temperature or the like were set to the same settings, but these values may also be appropriately adjusted.

Next, the effect of reoxidation will be described. As shown in FIG. 2B, if reoxidation is not performed on the plasma generating chamber member 6, the ashing rate for the plasma generating chamber member 6 will drop from 1000 nm/min to 500 nm/min after approximately 10 hours of discharge, and replacement will be necessary after approximately 30 hours. On the other hand, as shown in FIG. 2A, if reoxidation of the Si in the plasma generating chamber member 6 is performed using oxygen plasma at processing lot intervals, the ashing rate will not decrease and will tend to be close to the original value, and therefore the ashing rate can be stabilized.

As described above, the change in the ashing rate is affected by the degree of deactivation of the hydrogen radicals which contribute to the resist ashing reaction. As shown in FIG. 3, the degree of hydrogen radical deactivation for Si was large compared to other materials such as $SiO_2$, $Al_2O_3$, and Al. Therefore, reoxidizing the Si using oxygen plasma after each processing lot as described above is highly effective at preventing a reduction in the ashing rate.

Next, the effect when the plasma generating chamber member 6 is made of alumina ($Al_2O_3$) will be described. As can be seen from FIG. 4, reduction is more difficult when the plasma generating chamber member 6 is made from $Al_2O_3$ than when made from $SiO_2$, so the ashing rate can be maintained for a relatively longer period of time (approximately 75 hours in the figure). Furthermore, as shown in FIG. 3, the reason is that there is almost no difference in the deactivation of hydrogen radicals even though a portion of the $Al_2O_3$ is converted to Al by reduction. However, when the majority of the $Al_2O_3$ is reduced to Al after discharging for a long period of time, the ashing rate drops off rapidly. This is because the microwaves are shielded because the plasma generating chamber member 6 has changed from a dielectric ($Al_2O_3$) to a metal (Al), and plasma can no longer be generated.

When the effect of the aforementioned example is described in detail, the plasma generating chamber member 6 was made of alumina ($Al_2O_3$), and the processing conditions were: 350 sccm of $H_2$ as the processing gas, pressure of 100 Pa, microwave power of 1000 W, and a support stand temperature of 350° C. Furthermore, the reoxidation gas was $O_2$ at 7000 sccm, pressure of 100 Pa, microwave power of 1000 W, and a support stand temperature of 350° C.

As shown in FIG. 4A, when the plasma generating chamber member 6 is made of $Al_2O_3$, the ashing rate can be maintained for a relatively long time even if reoxidation is not performed as compared to when constructed of $SiO_2$ as shown in FIG. 4B.

However, with $Al_2O_3$, if the majority is reduced to Al by discharging for a long time (75 hours or more), the ashing rate will suddenly drop. Therefore, by also using a reoxidation process using oxygen plasma on plasma generating chamber members 6 made from $Al_2O_3$, the processing operation can be stable for a long period of time, and a stable rate of at least 150 hours or more will be possible.

OTHER EMBODIMENTS

Figure 7:
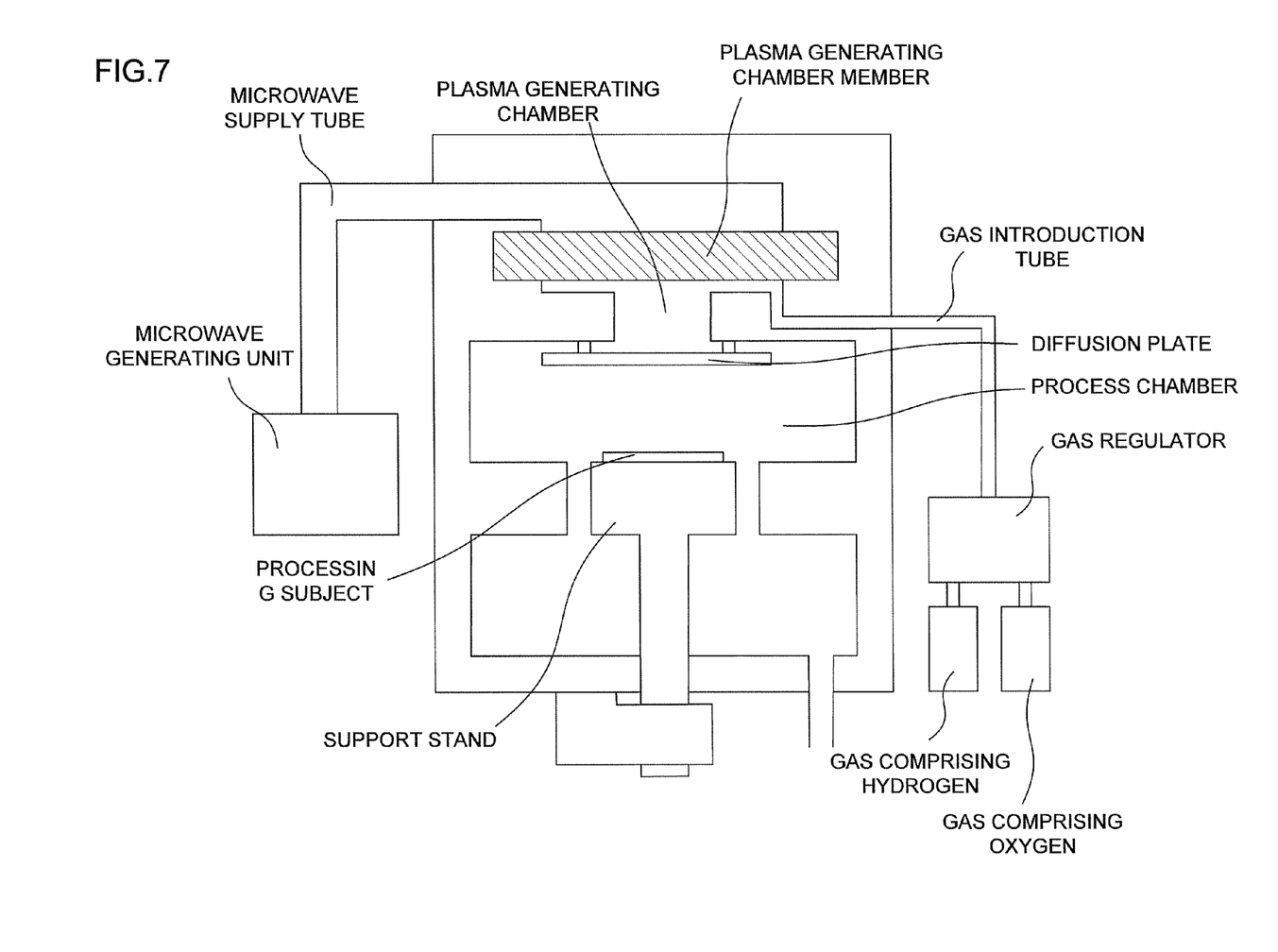
FIG. 7 is a block diagram showing an embodiment of the present invention.
Figure 8:
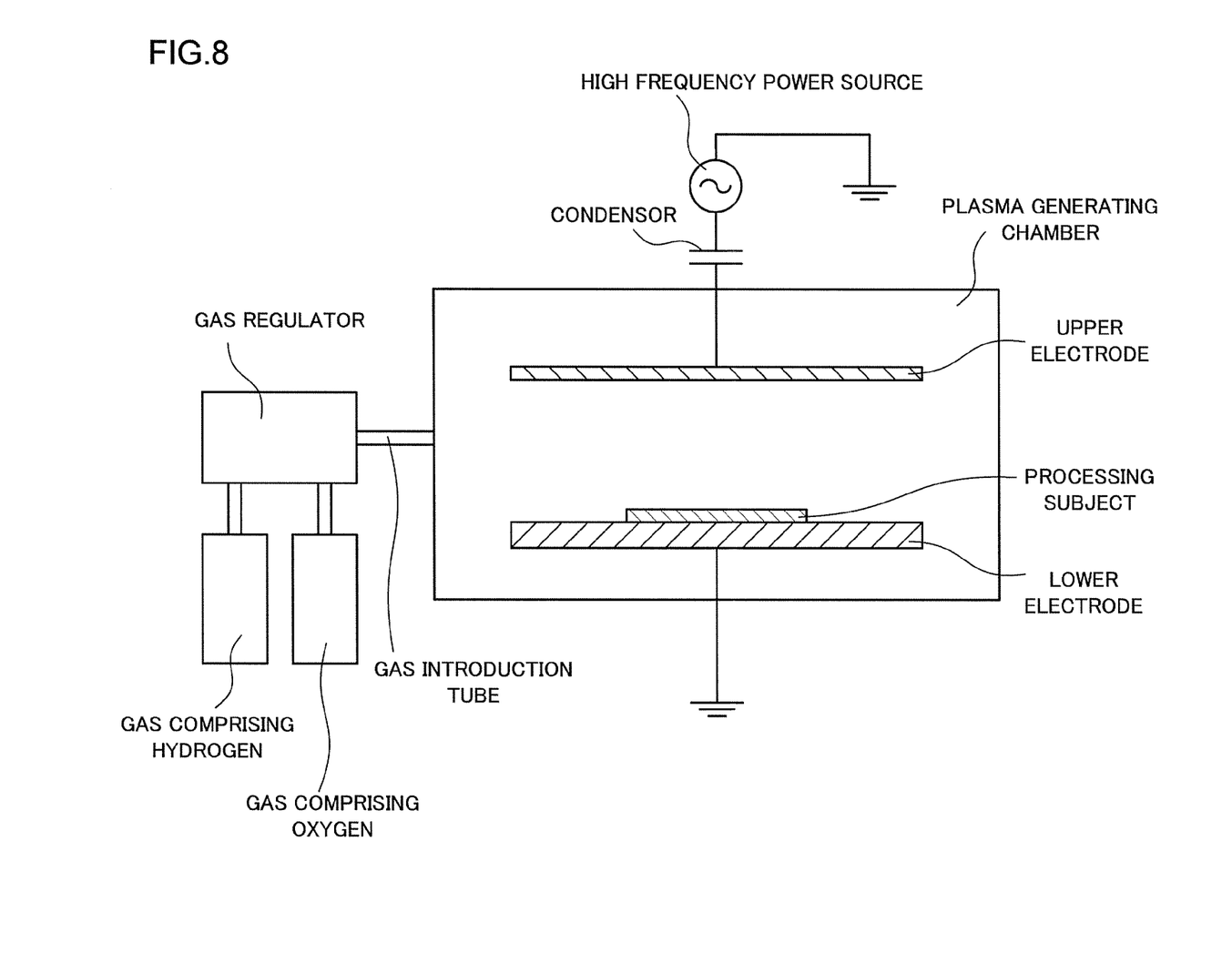
FIG. 8 is a block diagram showing an embodiment of the present invention.

Note, the present invention is not restricted to the aforementioned embodiments, and other embodiments can also be used as presented below. In the aforementioned embodiments, the case of a so-called chemical dry etching (CDE) plasma processing device was described, but the plasma process of the present invention is not restricted thereto, and may be applied to other devices which perform processing using plasma of a reductive gas such as hydrogen. For example, a so-called downflow type plasma processing device for dry etching as shown in FIG. 7, a reactive ion etching (RIE)

device as shown in FIG. 8, and the device shown in the aforementioned Patent Document 4 can be applicable.

Furthermore, the subject of reoxidation is not restricted to the plasma generating chamber member, and may also include any member that is reduced by reductive plasma processing. This is because even if members of the plasma generating chamber, inner wall of the process chamber, diffusion plate, or members in proximity to the support stand are reduced, the level of hydrogen radical deactivation will increase and the processing rate will decrease. The present invention has effects which can prevent deactivation of hydrogen radicals and maintain a high processing rate by performing reoxidation of the aforementioned members.

Furthermore, in the aforementioned embodiments, the case of a gas blend of hydrogen gas and He gas was described as a representative gas used for reductive plasma processing. However, the gas which is used in the reductive plasma process of the present invention is not restricted thereto, and for instance the case where hydrogen gas is used alone, the case where other reductive gases (such as ammonia gas or the like) are used alone, or the case of a gas blend of these reductive gases with an inert gas (for instance He or Ar or the like) or nitrogen gas is also possible. Similarly, with the aforementioned embodiments, the case where oxygen gas was used alone as the gas used for reoxidation was described, but the gas used for reoxidation of the present invention is not restricted thereto, and gas blends with a inert gases (such as He or Ar or the like), nitrogen gas, or $H_2O$ or the like are also possible.

TEXT IN FIGURES

FIG. 1
4 GAS INTRODUCTION PORT
3 SHOWER NOZZLE
2 SUPPORT STAND
11 MICROWAVE SUPPLY TUBE
5 GAS INTRODUCTION TUBE
1b EXHAUST PORT
12 MICROWAVE GENERATING UNIT
7 GAS REGULATOR
10 APPLICATOR
6a PLASMA GENERATING CHAMBER
6 PLASMA GENERATING CHAMBER MEMBER
S PROCESSING SUBJECT
1 PROCESS CHAMBER
1a EXHAUST PORT
EXHAUST
8 TANK
9 TANK
FIG. 2
EFFECT OF REOXIDATION USING O2 PLASMA
WITH REOXIDATION
WITHOUT REOXIDATION
DISCHARGE TIME [hr]
FIG. 3
ASHING RATE AND DISCHARGE CHAMBER MEMBER MATERIAL
(DEACTIVATION OF HYDROGEN RADICALS)
FIG. 4
DIFFERENCES IN ASHING RATE TRENDS DEPENDING ON DISCHARGE
CHAMBER MEMBERS
DISCHARGE TIME [hr]
FIG. 5
13b LIGHT EMISSION SPECTRUM MONITOR
13a LIGHT EMISSION DETECTION SENSOR
FIG. 6
14 MICROWAVE MATCHING DEVICE
FIG. 7
MICROWAVE SUPPLY TUBE
MICROWAVE GENERATING UNIT
PROCESSING SUBJECT
SUPPORT STAND
PLASMA GENERATING CHAMBER
PLASMA GENERATING CHAMBER MEMBER
GAS INTRODUCTION TUBE
DIFFUSION PLATE
PROCESS CHAMBER
GAS REGULATOR
GAS COMPRISING HYDROGEN
GAS COMPRISING OXYGEN
FIG. 8
GAS REGULATOR
GAS INTRODUCTION TUBE
GAS COMPRISING HYDROGEN
GAS COMPRISING OXYGEN
HIGH FREQUENCY POWER SOURCE
CONDENSOR
PLASMA GENERATING CHAMBER
UPPER ELECTRODE
PROCESSING SUBJECT
LOWER ELECTRODE

The invention claimed is:

1. A plasma processing method for performing plasma processing on a processing subject by introducing a gas into a plasma generating chamber formed at least in part of a dielectric material, exciting said gas to generate a plasma, and using said gas plasma to perform said plasma processing, said method comprising:
a step of supplying a reductive gas to the plasma generating chamber;
a step of introducing a reoxidizing gas to said plasma generating chamber in place of said reductive gas, when a member that contacts reductive plasma generated by exciting said reductive gas is reduced;
a step of detecting whether reduction has occurred due to the reductive plasma generated by exciting said reductive gas or, whether reoxidizing has occurred by introducing the reoxidizing gas to said plasma generating chamber; and
a step of switching the gas to be introduced based on a detection result.

2. The plasma processing method according to claim 1, wherein said reoxidizing gas comprises oxygen.

3. The plasma processing method according to claim 1, wherein said dielectric material is made from any one of quartz, alumina, sapphire, or aluminum nitride.

4. A method of re-oxidizing a dielectric material, subject to a reductive gas in a plasma state and operatively connected to a plasma generating chamber with a gas regulator that introduces gas to the plasma generating chamber comprising:
monitoring a characteristic of a resultant deoxidation of the dielectric material in contact with the reductive plasma gas;
stopping the generation of the reductive gas plasma based on the monitored characteristic of the deoxidized dielectric; and
introducing a reoxidizing gas in a plasma state to the dielectric material for a time period to restore the dielectric material to a predetermined oxidized state.

5. The method of re-oxidizing of claim 4 wherein the dielectric material is made from any one of quartz, alumina, sapphire, or aluminum nitride.

6. The method of re-oxidizing of claim 4 wherein the stopping of the generation of the reductive gas plasma and subsequent introduction of the re-oxidizing gas is performed automatically in response to an output from a signal from a detecting unit.

7. The method of re-oxidizing of claim 6 wherein light emission is the characteristic monitored by the detecting unit.

8. The method of re-oxidizing of claim 7 wherein the monitoring of light emission includes one or more wavelengths of 434 nm, 486 nm and 656 nm.

9. The method of re-oxidizing of claim 7 wherein the monitoring of light emissions from a hydrogen plasma gas is monitored by the detecting unit.

* * * * *